(12) United States Patent
Stahr et al.

(10) Patent No.: US 9,055,706 B2
(45) Date of Patent: Jun. 9, 2015

(54) METHOD FOR INTEGRATING AN ELECTRONIC COMPONENT INTO A PRINTED CIRCUIT BOARD

(75) Inventors: Johannes Stahr, St. Lorenzen (AT); Markus Leitgeb, Trofaiach (AT)

(73) Assignee: AT & S AUSTRIA TECHNOLOGIE & SYSTEMTECHNIK AKTIENGESELLSCHAFT, Leoben-Hinterberg (AT)

( * ) Notice: Subject to any disclaimer, the term of this patent is extended or adjusted under 35 U.S.C. 154(b) by 225 days.

(21) Appl. No.: 13/635,364

(22) PCT Filed: Apr. 11, 2011

(86) PCT No.: PCT/AT2011/000172
§ 371 (c)(1),
(2), (4) Date: Sep. 14, 2012

(87) PCT Pub. No.: WO2011/127503
PCT Pub. Date: Oct. 20, 2011

(65) Prior Publication Data
US 2013/0008703 A1  Jan. 10, 2013

(30) Foreign Application Priority Data
Apr. 13, 2010  (AT) .................. GM236/2010

(51) Int. Cl.
*H05K 3/20* (2006.01)
*H05K 3/46* (2006.01)
*H05K 1/18* (2006.01)

(52) U.S. Cl.
CPC ......... *H05K 3/4697* (2013.01); *Y10T 29/49126* (2015.01); *Y10T 29/49144* (2015.01);
(Continued)

(58) Field of Classification Search
USPC ........ 29/417, 592.1, 593, 831, 842, 846, 854; 324/754, 755, 758, 761, 765; 438/14–18
See application file for complete search history.

(56) References Cited

U.S. PATENT DOCUMENTS 5,945,834 A * 8/1999 Nakata et al. ............ 324/750.05
6,147,505 A * 11/2000 Ott et al. .................. 324/754.15
(Continued)

FOREIGN PATENT DOCUMENTS

| | | |
|---|---|---|
| CN | 101331814 A | 12/2008 |
| DE | 102007036045 | 2/2009 |

(Continued)

OTHER PUBLICATIONS

European Office Action issued on Aug. 6, 2014, to a corresponding European Patent Application 11 730 863.5-1803.
(Continued)

*Primary Examiner* — Paul D Kim
(74) *Attorney, Agent, or Firm* — Jacobson Holman, PLLC.

(57) ABSTRACT

A method for integrating a component into a printed circuit board includes the following steps: providing two completed printed circuit board elements, which more particularly consist of a plurality of interconnected plies or layers, wherein at least one printed circuit board element has a cutout or depression, arranging the component to be integrated on one of the printed circuit board elements or in the cutout of the at least one printed circuit board element, and connecting the printed circuit board elements with the component being accommodated in the cutout, as a result of which it is possible to obtain secure and reliable accommodation of a component or sensor in a printed circuit board. Furthermore, a printed circuit board of this type comprising an electronic component integrated therein is provided.

11 Claims, 2 Drawing Sheets

Figure 1:
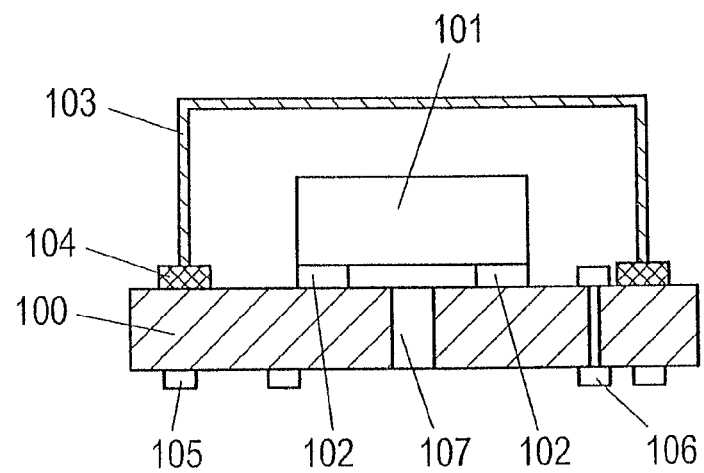

(52) U.S. Cl.
CPC .............. *H05K1/186* (2013.01); *H05K 3/4623* (2013.01); *H05K 2201/0723* (2013.01); *H05K 2201/09036* (2013.01); *H05K 2201/09072* (2013.01); *H05K 2201/09618* (2013.01); *H05K 2201/10083* (2013.01); *H05K 2201/10151* (2013.01)

(56) References Cited

U.S. PATENT DOCUMENTS

| | | | |
|---|---|---|---|
| 6,759,258 B2 * | 7/2004 | Kasukabe et al. | 438/17 |
| 7,751,202 B2 * | 7/2010 | Seo et al. | 361/795 |
| 2007/0176613 A1 | 8/2007 | Ogawa | |
| 2008/0007927 A1 | 1/2008 | Ito et al. | |
| 2009/0042336 A1 | 2/2009 | Paik | |
| 2009/0097214 A1 | 4/2009 | Lee | |

FOREIGN PATENT DOCUMENTS

| | | |
|---|---|---|
| GB | 2451921 | 2/2009 |
| WO | 2008/098269 | 8/2008 |
| WO | 2010/095210 | 8/2010 |

OTHER PUBLICATIONS

Chinese Office Action issued on Sep. 2, 2014, to a corresponding Chinese Patent Application 201180018622.1.

* cited by examiner

METHOD FOR INTEGRATING AN ELECTRONIC COMPONENT INTO A PRINTED CIRCUIT BOARD

This is a national stage of PCT/AT2011/000172 filed Apr. 11, 2011 and published in German, which has a priority of Austria, no. GM 236/2010 filed Apr. 13, 2010, hereby incorporated by reference.

FIELD OF THE INVENTION

The present invention relates to a method for integrating an electronic component into a printed circuit board, and a printed circuit board of this type, comprising an electronic component integrated therein.

PRIOR ART

In the context of the production of printed circuit boards having at least one electronic component integrated therein, it is known to accommodate such an electronic component in an, in particular multilayer, circuit board, particularly by adapting such multilayer circuit board layers or plies surrounding the component, whereupon methods known per se for connecting such, in particular different, layers of a multilayer circuit board are employed. In order to connect such layers or plies of a multilayer circuit board, such composite assembly structures are usually subjected to elevated pressures and/or temperatures to at least partially soften or melt at least layers comprised of synthetic materials such as resins or the like, in order to ensure the desired connection of the layers or plies and the embedment of at least one electronic component in the printed circuit board. Such a method for embedding an electronic component in a printed circuit board, in which also the electronic component is subjected to such method steps to produce the desired connections, will result in the complete sheathing or embedding of such a component within the multilayer circuit board, which is usually desired for a specific mode of construction of electronic components, by the softening or melting of, in particular surrounding, synthetic layers. Known methods of this type, in which an electronic component is immediately integrated during the formation of the multilayer structure of the printed circuit board and subsequently subjected to appropriate treatment or processing steps for establishing the connection between the individual layers or plies of a printed circuit board, are, however, not applicable unless such a connection of the component with surrounding and, in particular, insulating materials is desired or acceptable.

An embodiment in which such an immediate embedding of an electronic component is not desired or unrewarding has, for instance, become known from GB-A 2 451 921, wherein an electronic component, for instance a capacitive microphone, is arranged on a multilayer circuit board. For shielding, a metallic shield in the manner of a lid is fixed to the multilayer printed circuit board in separate and cumbersome additional operating steps following the arrangement of the component on the multilayer circuit board, wherein it is immediately apparent that such a separate production and fixation of a shield formed, for instance, by a metal cage, which will, moreover, not allow for the protected and safe accommodation of the component, involves considerable additional expenditures.

SUMMARY OF THE INVENTION

The present invention, therefore, aims to provide both a method for integrating an electronic component into a printed circuit board, and such a printed circuit board comprising a component integrated or embedded therein, wherein the drawbacks of the prior art are avoided and a connection or substantially complete sheathing of such an integrated component during subsequent processing or treatment steps of such a printed circuit board are reliably avoided while ensuring protected accommodation of the component.

To solve these objects, a method of the initially-defined kind is substantially characterized by the steps of:
 providing two completed printed circuit board elements, which more particularly consist of a plurality of interconnected layers or plies, wherein at least one printed circuit board element comprises a cutout or depression;
 arranging the component to be integrated on one of the printed circuit board elements or in the cutout of the at least one printed circuit board element; and
 connecting the printed circuit board elements with the component being accommodated in the cutout.

In that, as in accordance with the invention, two completed printed circuit board elements which, in particular, each consist of a plurality of interconnected layers or plies are provided, wherein at least one printed circuit board element comprises a cutout or depression for subsequently accommodating the component to be integrated into the printed circuit board, it will be ensured that, during subsequent treatment or processing steps of the printed circuit board, for instance even while connecting the two completed printed circuit board elements, a new or additional deformation of individual layers or plies of the printed circuit board element will be reliably avoided, since, in particular, no changes of the dimensions of the cutout or depression will occur or will have to be expected, which will secure the accommodation of the electronic component in the assembled state of the printed circuit board elements to be connected. It is thus essential for the method according to the invention to provide the printed circuit board elements to be made available for embedding or integrating the electronic component as semi-finished or finished products with which, as opposed to known method controls during subsequent processing or treating steps, no deformation or the like of individual layers of the printed circuit boards need to be feared so as to avoid, in the region of the cutout or depression, any deformation of the free space provided for accommodating the electronic component. Depending on the properties of the electronic component to be integrated or accommodated, at least one cutout is provided in at least one of the completed printed circuit board elements in order to subsequently provide a sufficiently large and accordingly fitted space of accommodation for the electronic component to be accommodated, to protectedly accommodate the same therein, when arranging and accommodating the electronic component in the at least one cutout. Instead of forming a cutout in just one printed circuit board element for accommodating the entire electronic component in said printed circuit board element in the assembled state, it is, of course, also possible to provide matching cutouts or depressions in both printed circuit board elements, which, in the assembled and connected state, will provide the free space required for accommodating the electronic component.

By using completed printed circuit board elements for accommodating the electronic component, the individual mounting of modules can be renounced, in particular when using printed circuit board manufacturing processes known per se, since a plurality of printed circuit board elements may each be provided or accommodated in a common carrier element or a format adapted to a printed circuit board manufacturing line, as is known per se, such that, by connecting a plurality of prefinished printed circuit board elements each accommodated in such formats or carrier elements in a common manufacturing operation, a plurality of such modules each consisting of two previously completed printed circuit board elements and an electronic component integrated therein can be provided. The modules are subdivided or separated in subsequent processing or treatment steps, as is also known per se. In this manner, the expenditures involved in the production of, in particular, large numbers of such modules will be further reduced.

For the simple and reliable accommodation of such an electronic component to be integrated, and for the optionally required adaptation to the properties of such an electronic component to be integrated, and/or its field of application, it is proposed according to a preferred embodiment that the dimensions of the cutout are selected to exceed the dimensions of the component in at least one direction of extension of the component. Thus, not only the simple adaptation or the reliable and simple accommodation of the electronic component in the at least one depression or cutout will be ensured, but it will also be possible to provide a free space adapted to the application properties of the electronic component, as will be discussed in more detail below.

According to a further preferred embodiment, it is proposed that the dimensions of the cutout exceed the dimensions of the component in the at last one direction of extension by at least 5%, in particular at least 15%, of the respective dimension of the component, wherein it is proposed according to a further preferred embodiment that the dimensions of the cutout are selected to exceed the dimensions of the component in any direction of extension of the component. It will thereby be possible to accommodate different electronic components in printed circuit board elements provided, completed, and to be connected, according to the invention.

In accordance with a further preferred embodiment, it is proposed by the invention that the electronic component to be integrated is formed by a sensor, for instance for determining the temperature, moisture, pressure, sound, brightness, acceleration, spatial position, composition of gaseous or liquid media, a high-frequency element or the like. In particular due to the fact that, as already pointed out in detail above, two completed printed circuit board elements are provided, at least one of which provides a cutout or depression for accommodating an electronic component to be integrated, with the dimensions of the cutout preferably exceeding the dimensions of the electronic component to be accommodated, such an electronic component in the form of a sensor for detecting or determining an extremely large plurality of different measurands can be used and reliably and safely integrated in a printed circuit board.

The method proposed according to the invention thus manages to integrate in a printed circuit board, and for instance use in the context of MEMS technology, the most different sensors.

As indicated above, it is possible, by configuring the electronic component to be integrated as a sensor, to determine a different plurality of measuring data, wherein coupling of the sensor to the external environment will be required for some of the measuring data. In this respect, it is proposed that at least one passage opening running into the cutout for accommodating the component to be integrated is formed in a printed circuit board element, as in correspondence with a further preferred embodiment of the invention. In this manner, gaseous or liquid media can, for instance, be introduced through the passage opening provided by the invention into the free space in which the sensor is directly integrated in the printed circuit board, in order to determine their composition and physical values such as the temperature, moisture, pressure, sound or the like.

In some cases, appropriate shielding of the sensor is required to prevent measuring data or values to be determined by the sensor from being affected by environmental influences. In this context, it is proposed according to a further preferred embodiment of the method according to the invention that the electronic component, in its state accommodated in the cutout, is shielded from the external environment of the two printed circuit board elements and/or neighboring regions of the printed circuit board elements.

In order to avoid influences by, for instance, electromagnetic radiation, which may be derived from further components integrated in the circuit board or from the external environment of the printed circuit board, it is proposed according to a preferred embodiment that shielding is at least partially provided by substantially full-surface, conducting layers of the printed circuit board elements. Such substantially full-surface, conducting layers not only can, for instance, be used for establishing electromagnetic shielding in the form of a Faraday cage, but will also provide appropriate shielding against external influences by preventing, for instance, gaseous or liquid media from passing through such layers.

For the coupling or connection of individual conducting regions accommodated during the formation of the individual printed circuit board elements for shielding the electronic component to be integrated, it is proposed according to a further preferred embodiment that, in order to provide shielding against electromagnetic radiation in a manner substantially surrounding the component about its entire periphery, conducting regions of the printed circuit board elements used for shielding are additionally connected by conducting contact connections between the conducting regions of the printed circuit board elements.

In addition to the shielding against electromagnetic radiation by providing electromagnetic shielding substantially surrounding an electronic component to be integrated over its entire periphery in the manner of a Faraday cage, the substantially hermetically tight shielding or encapsulation of such a sensor against external environmental influences will be required in some forms of application, wherein, in particular synthetic layers, which are for instance used as insulating materials in multilayer circuit boards, will not comprise the necessary imperviousness. It is, moreover, immediately apparent that in the region of contact connections of the electronic component it will not be possible, in order to avoid short-circuits, to use substantially full-surface, conducting shields, which, because of their material properties, would optionally also provide appropriate shielding against external environmental influences. In this respect it is proposed according to a further preferred embodiment, in order to ensure shielding against such environmental influences while, at the same time, provide safe contacting of the component, that, in the region of contact connections of the component to be integrated, a layer of a hermetically tight, non-conducting material is embedded in a printed circuit board element and a contact connection of the component is realized by blind holes formed through the hermetically sealing layer and filled with a conductive material, a plating or the like. Such hermetically sealing layers or plies can be simply and reliably accommodated in a multilayer circuit board as a function of the intended position of the electronic component to be integrated and will provide adequate hermetic sealing against environmental influences, particularly in the region of contact connections of such components.

In the context of the increasingly sought miniaturization of components and even printed circuit board elements, and to further avoid interference effects, it is, moreover, frequently aimed to arrange at least parts of an evaluation unit of electronic sensors or components in as close a vicinity to such components or sensors as possible. In this context, it is proposed according to a further preferred embodiment of the method according to the invention that evaluation electronics for the component is integrated in the printed circuit board element on which the electronic component is supported, or to which the electronic component is contact-connected. Such an additional integration of the evaluation electronics likewise in at least one of the printed circuit board elements, and hence in the immediate vicinity of the electronic component to be integrated, will, for instance, enable the evaluation electronics to be adequately protected from environmental influences directly with the component by being accommodated within the shielding.

For the particularly reliable and simple connection of the completed printed circuit board elements to be connected after the accommodation of the electronic component, it is, moreover, proposed that the connection of the printed circuit board elements in a manner known per se is performed by soldering, eutectic bonding, thermocompression bonding, diffusion soldering, using a conductive adhesive and/or conducting or conductive adhesive films or the like, as in correspondence with a preferred embodiment of the method according to the invention. Such connecting methods are known per se in the context of the manufacture of printed circuit boards so as to be immediately applicable without having to elaborately modify or expand manufacturing processes for multilayer circuit boards. These connecting methods, moreover, ensure that changes in the structures of the completed printed circuit board elements, which might possibly affect the free space to be provided for accommodating the electronic component, are safely avoided.

In order to produce a cutout or depression in at least one printed circuit board element, which will subsequently serve to accommodate the electronic component, it is proposed according to a further preferred embodiment that the cutout is produced in the at least one printed circuit board element by clearing a partial region of the printed circuit board element after having connected printed circuit board element layers to be connected, using a material preventing the adhesion of said partial region. Such methods for producing cutouts or recesses or depressions by clearing partial regions of a multilayer circuit board are known per se and can be incorporated in a particularly simple and reliable manner in the method according to the invention.

To solve the initially-mentioned objects, a printed circuit board comprising an electronic component integrated therein is, moreover, essentially characterized by two completed printed circuit board elements, which more particularly consist of a plurality of interconnected layers or plies, wherein at least one printed circuit board element comprises a cutout or depression; and an electronic component arranged on one of the printed circuit board elements or in the cutout of the at least one printed circuit board element;

wherein the printed circuit board elements are connected or connectable after the accommodation of the component in the cutout.

In this manner, it is possible in a simple and reliable fashion as already pointed out above, to provide a printed circuit board comprising an electronic component integrated therein, whereby it will, in particular, be ensured that even after or during the connection of the completed printed circuit board elements no influence or impairment of the free space to be provided for accommodating the electronic component need to be feared.

For simply fitting in the component, and also adapt it to optionally different purposes of use of the electronic component to be integrated, it is preferably proposed for the printed circuit board according to the invention that the dimensions of the cutout for accommodating the electronic component exceed the dimensions of the component in at least one direction of extension thereof.

As already indicated above, it is proposed according to a preferred embodiment that the dimensions of the cutout exceed the dimensions of the component in at last one direction of extension by at least 5%, in particular at least 15%, of the dimension of the component, wherein it may be proposed according to a further preferred embodiment that the dimensions of the cutout are selected to exceed the dimensions of the component in any direction of extension of the component. It will thereby be possible to provide an accordingly large free space for accommodating the electronic component.

In order to determine different measuring data or values by using a printed circuit board according to the invention, it is, moreover, proposed that the electronic component to be integrated is formed by a sensor, for instance for determining the temperature, moisture, pressure, sound, brightness, acceleration, spatial position, composition of gaseous or liquid media, a high-frequency element or the like, as in correspondence with a further preferred embodiment of the printed circuit board according to the invention.

In order to determine different physical and/or chemico-physical properties or parameters of gaseous or liquid media to be examined, it is, moreover, proposed according to a further preferred embodiment that at least one passage opening running into the interior of the cutout for accommodating the component is provided.

In order to provide shielding of the component against external environmental influences, it is, moreover, contemplated that partial shielding of the component in its state accommodated in the cutout from the external environment and/or neighboring partial regions of the printed circuit board is provided, as in correspondence with a further preferred embodiment of the printed circuit board according to the invention.

In particular in order to provide shielding against electromagnetic radiation, it is contemplated according to a further preferred embodiment that said shielding is at least partially provided by substantially full-surface, conducting layers of the printed circuit board elements. The integration of such substantially full-surface, conducting layers in the printed circuit board elements in this case is possible in a simple and reliable manner, in particular when producing multilayer printed circuit boards.

In order to achieve shielding substantially surrounding the electronic component over its entire periphery, it is, moreover, preferably proposed that conducting regions of the printed circuit board elements used for shielding are additionally connected by conducting contact connections between the conducting regions of the printed circuit board elements. Such conducting contact connections can be produced in a simple and reliable manner by steps that are common and known in the manufacture of a printed circuit board.

In addition to shielding against, for instance, electromagnetic radiation, particularly by using appropriately conducting materials to build a Faraday cage, shielding and sealing against gaseous or liquid media may be required in special cases of use of such an electronic component or sensor to be integrated, wherein synthetic materials used, for instance, in the production of printed circuit boards may possibly not comprise the required shielding effect against such substances. In order to achieve hermetically tight sealing effects also in the region of contact connections of the electronic component to be integrated, where, in particular, materials conducting in full-surface fashion or metallic materials, which would possibly have the required sealing properties, cannot be used to avoid short-circuits or the like, it is proposed according to a further preferred embodiment that, in the region of contact connections of the component to be integrated, a layer of a hermetically tight, non-conducting material is embedded in a printed circuit board element and a contact connection of the component is realized by blind holes formed through the hermetically sealing layer and filled with a conductive material, a plating or the like. Such hermetically tight and, in particular, non-conducting materials also can be integrated in a simple manner in the context of the manufacture of printed circuit board elements.

In order to simplify and assist the detection and evaluation of the measurements provided by the electronic components or sensors, and also to enable further miniaturization, as small a spatial distance as possible between the sensor, or the electronic component, and an evaluation electronics is desired or required, as already indicated above. In this respect, it is proposed that evaluation electronics for the electronic component is integrated in the printed circuit board element on which the component is supported, or to which the electronic component is contact-connected, as in correspondence with a further preferred embodiment of the printed circuit board according to the invention.

In order to achieve a reliable connection of the printed circuit board elements, which will optionally also provide desired sealing properties, it is, moreover, preferably proposed for the printed circuit board according to the invention that the connection of the printed circuit board elements in a manner known per se is formed by soldering, eutectic bonding, thermocompression bonding, diffusion soldering, using a conductive adhesive and/or conducting or conductive adhesive films or the like.

SHORT DESCRIPTION OF THE DRAWINGS

Figure 2:
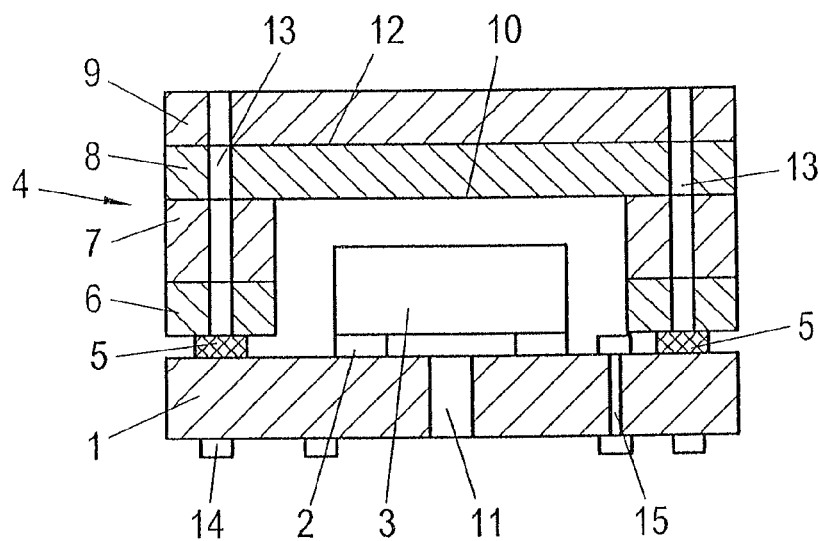
Figure 3:
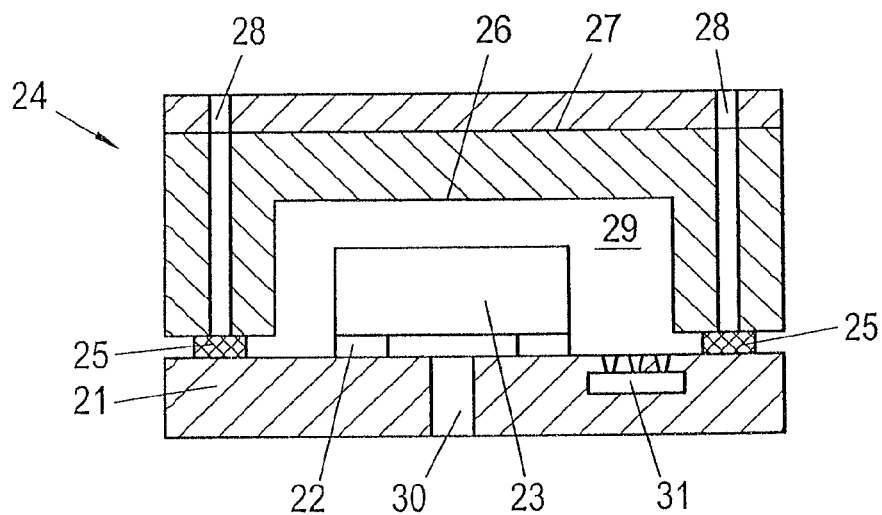

In the following, the invention will be explained in more detail by way of exemplary embodiments schematically illustrated in the accompanying drawing.
Therein:
FIG. 1 is a schematic illustration of a printed circuit board comprising an electronic component arranged thereon, according to the prior art;
FIG. 2 is a schematic illustration of a first inventive embodiment of a printed circuit board comprising an electronic component integrated therein and produced by the method according to the invention;
FIG. 3, in an illustration similar to that of FIG. 2, depicts a modified embodiment of a printed circuit board according to the invention, with an evaluation electronics being additionally provided in the immediate vicinity of the integrated electronic component;
FIG. 4, again in an illustration similar to that of FIG. 2, depicts a further modified embodiment of a printed circuit board according to the invention, with the component being arranged in the cutout provided in a printed circuit board element; and FIG. 5 is a schematic illustration of a further modified embodiment of a printed circuit board according to the invention, wherein a hermetic seal is also provided in the region of contacts of the electronic component to be integrated.

DETAILED DESCRIPTION OF PREFERRED EMBODIMENTS

From the configuration according to the prior art as is schematically indicated in FIG. 1, it is apparent that an electronic component 101 is arranged on a printed circuit board element 100, which may, for instance, consist of a plurality of different layers or plies, which are not shown in detail, wherein only two contacts 102 are schematically indicated. The electronic component 101 is, for instance, formed by a microphone, wherein a metallic cage 103 is indicated to achieve appropriate shielding of the electronic component arranged on the printed circuit board element 100, said cage being connected, via connections 104, to conducting elements not illustrated in detail. Further contact connections of the printed circuit board, or structured conducting elements of the same, are schematically indicated by 105 and 106.

According to the prior art, an electronic component 101 to be additionally protected or shielded is thus arranged on a surface of a printed circuit board, wherein, in the present case, which uses the electronic component 101 as a microphone, a hole or passage opening 107 for the sound to be recorded by the microphone 101 is indicated. It is immediately apparent that this known embodiment not only involves considerable additional expenditures for the subsequent production of the shield 103, which is, for instance, formed by a metal cage, but also can by no means ensure an adequately protected or safe accommodation of the electronic component 101.

In the embodiment according to the invention, which is represented in FIG. 2, an, in particular multilayer, printed circuit board element 1 is provided similarly as in the prior art according to FIG. 1, to which an electronic component 3 is again fixed via schematically indicated contacts 2.

Via connections 5, which will be discussed in more detail below, a second printed circuit board elements 4 is connected to the previously completed printed circuit board element 1, wherein a plurality of different layers or plies 6, 7, 8 and 9 are to be seen or indicated in the second printed circuit board element 4. The likewise previously completed printed circuit board element 4 is, moreover, formed with a cutout or recess or depression 10, whose dimension in the embodiment illustrated in FIG. 2 exceeds the dimensions of the electronic component 3 in any direction of extension, wherein the distances, or the free space, between the component 3 and the boundary walls of the recess or depression 10 are shown not true to scale but extremely large, in particular to elucidate the illustration.

When again using the component 3 as a microphone, a passage opening or sound hole 11 is also provided in the printed circuit board 1 similarly as in the embodiment according to FIG. 1.

In order to achieve appropriate shielding against electromagnetic radiation of the component or microphone 3, a metallic cage substantially completely surrounding the component 3 is formed by a substantially full-surface layer 12 of conductive material directly constituting a separation layer or ply of the previously completed multilayer printed circuit board element 4, and by contact connections 13 in the region of the contact connections or connections 5. Such contact connections 13 are formed by passage openings, which are known in the production of printed circuit boards and are, for instance, likewise filled with conductive material or at least plated therewith. When providing a connection 5 likewise of conducting material, e.g. a solder connection 5, reliable shielding integrated in the printed circuit board elements 1 and 4 will be immediately achieved upon connection of the two printed circuit board elements 1 and 4 after the arrangement of the electronic component or sensor 3.

When embedding a microphone 3 as a component to be integrated, achievement of sound qualities of the component will, for instance, also be possible by renouncing the metallic shield to be separately arranged as in the prior art according to FIG. 1, and embedding the component 3 into the prefabricated printed circuit board elements 1 and 4.

Additional structures or contacts 14 and 15 as are provided in the embodiment according to the prior illustrated in FIG. 1 are also shown in the printed circuit board element 1.

In the configuration according to FIG. 3, a previously completed printed circuit board element 21 is again provided as in the embodiment according to FIG. 2, on which an electronic component 23 is arranged so as to be supported by contacts 22.

To the printed circuit board element 1 is connected a second previously completed printed circuit board element 24, which is again formed by a multilayer printed circuit board element, such multiple layers or plies known per se having been omitted from FIG. 3 for reasons of simplicity.

Similarly as in the preceding embodiment, a connection 25 is again provided between the printed circuit board elements 21 and 24, wherein the electronic component 23 is arranged in a recess or depression 26 again provided in the printed circuit board element 24, whose dimensions, which are enlarged relative to the dimensions of the component 23, are again illustrated in an exaggerated manner for the sake of clarity.

For an additional shielding to be again provided when, for instance, used as a microphone, a substantially full-surface layer of a conductive metallic material in the printed circuit board element 24 is denoted by 27, wherein passage openings 28 are again indicated to complete the shield similarly as in the preceding embodiment, which passage openings again provide shielding surrounding the electronic component 23 during or after filling or at least plating with a conducting material, and when providing a connection 25 of conducting material.

A passage opening to the free space 29 defined by the recess 26, in which the component or sensor 23 is arranged or received or integrated, is denoted by 30.

In the embodiment illustrated in FIG. 3, it is additionally provided that evaluation electronics 31 for the component is provided in the immediate spatial vicinity and, in particular, integrated in the printed circuit board element 21 such that, in view of the miniaturization of such a modularly structured sensor directly integrated or integratable in a printed circuit board, the recording and/or evaluation of the measuring data or measured values determined by the sensor 23 will be enabled.

Figure 4:
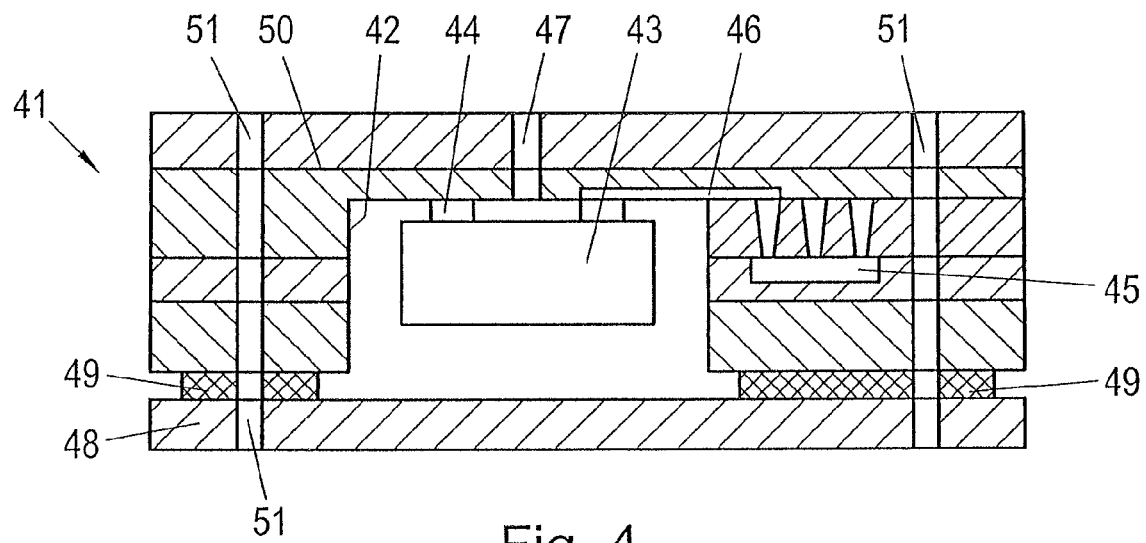
Figure 5:
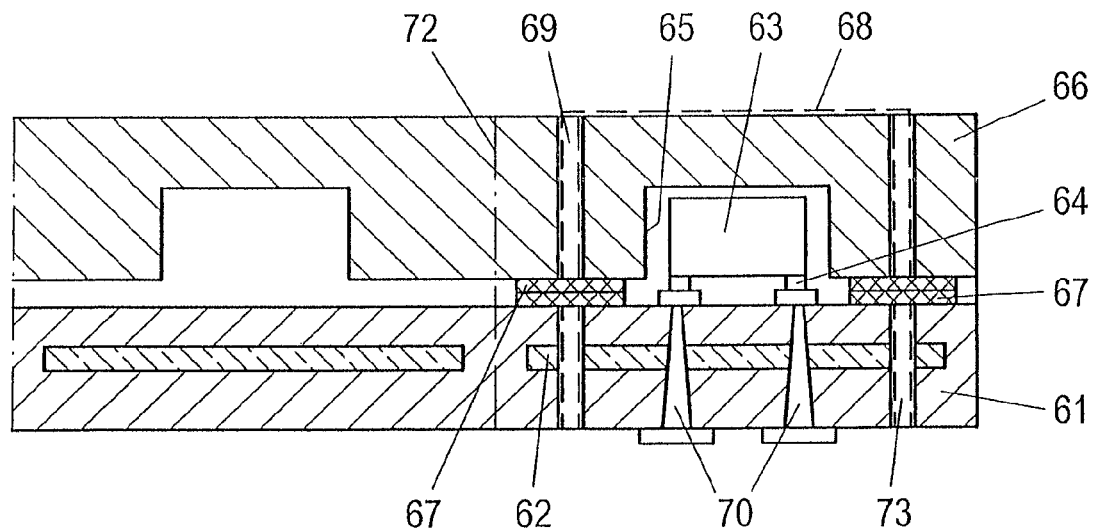

In the further modified embodiment represented in FIG. 4, a printed circuit board element 41 again consisting of several layers is provided with a recess or depression 42, wherein an electronic component 43 is directly fixed in said recess 42 of the printed circuit board element 41 via contacts 44. Similarly as in the preceding embodiment, evaluation electronics 45 is again integrated in the printed circuit board element 41 in the immediate vicinity of the component 43, a contact connection between the component 43 and the evaluation electronics being schematically indicated by 46. Also the embodiment according to FIG. 4 comprises a passage opening 47 for connecting the sensor or component 43 to the external environment.

Similarly as in the preceding embodiments, a further printed circuit board element 48 is connected or coupled to the printed circuit board element 41 via connections 49, wherein, in order to provide shielding, passage openings 51 are again provided with the appropriate metallic plating or the like beside a layer or ply 50 of conducting material, similarly as in the preceding embodiments.

From the schematic illustration according to FIG. 5, it is apparent that, as known per se in the manufacture of printed circuit boards, a great plurality of similar elements are usually produced in a common carrier or an accordingly large format, wherein, after the completion of the individual printed circuit boards, the latter are subdivided into individual modules or elements.

In the embodiment according to FIG. 5, it is, moreover, indicated that, unlike in the preceding embodiments according to FIGS. 2 to 4, a substantially hermetic seal of the electronic component to be accommodated is to be provided.

To this end, a layer or ply 62 of hermetically sealing material such as glass, ceramic or the like is provided or integrated in an already completed printed circuit board element 61, which is again comprised of a plurality of layers or plies, which are not illustrated in detail for the sake of simplicity. Similarly as in the preceding embodiments, an electronic component or sensor 63 is arranged in the printed circuit board element 61 via schematic contacts 64, said electronic component 63 being arranged or integrated in a recess 65 of a further printed circuit board element 66. Connection between the printed circuit board elements 61 and 66 is effected via schematically indicated connections 67.

In contrast to the preceding embodiments, the embodiment illustrated in FIG. 5 requires hermetic sealing of the component or sensor 63 against the external environment, wherein, in addition to the seal comprised of the hermetically sealing material 62, a plating 68 is provided in the printed circuit board element 66, which plating also extends into the respective passage holes or openings 69 in the region of the connections 67. By providing a continuous plating or full-surface material layer of a metallic material, adequate tightness will be provided, enabling a full-surface sheathing or shielding of the component 63 by the seal comprised of the material 62.

In the region of the hermetically sealing material 62, feedthroughs 70 are provided by suitable bores or blind holes penetrating the hermetically tight material 62. In this manner, adequate hermetic sealing of the component 63 can also be provided in the region of the contacts to be mutually separated.

The printed circuit board element 61, in addition to the feedthroughs 70, comprises slots or bores or passages 73 penetrating the material 62, which, similarly as the holes 69, are, for instance, galvanically plated to complete hermetic shielding in addition to electromagnetic shielding.

In FIG. 5, a separation line 72 for separating adjacent modules is, moreover, provided after the completion of the individual modules, only the printed circuit board elements 61 and 66, respectively, being schematically indicated for the adjacent module.

As opposed to the shown illustrations, it is known that such electronic components comprise an extremely large plurality of contacts or contact sites, wherein substantially only two contacts 2, 22, 44 and 64 are respectively indicated in the illustrations for the sake of simplicity.

It is, moreover, not necessarily required, in particular as a function of the purpose of use or application of the electronic component 3, 23, 43 or 63, as is shown in the illustrations particularly for reasons of elucidation, that the free spaces formed by the respective recesses or depressions 10, 26, 42 or 65 exceed by the extent shown the dimensions of the electronic component 3, 23, 43 or 63 to be respectively accommodated.

It may also be provided that the dimensions of the respective recess or depression 10, 26, 42 or 65 is substantially adapted to the dimensions of the component 3, 23, 43 or 63 to be accommodated or integrated such that the component will be received in the respective recess or depression in a substantially precisely fitting manner. What is essential is that by respectively providing completed printed circuit board elements 1, 4, 21, 24, 41, 48 or 61 and 66, the dimensions of the free space defined by the recesses 10, 26, 42 or 65 will be maintained unchanged.

To provide a connection 5, 25, 49, 67 of the printed circuit board elements 1, 4, 21, 24, 41, 48 or 61 and 66 to be connected, it will also be possible, besides a solder connection as indicated above, to realize such a connection by eutectic bonding, thermocompression bonding, diffusion soldering, or a connection using a conductive adhesive and/or conducting or conductive adhesive films, if shielding of conducting materials is required. Unless such continuous shielding of the component of conducting material, for instance by forming a Faraday cage, is required, adhesive connections of non-conductive materials may, for instance, also be provided.

Besides the configuration, for instance, as a microphone of the electronic component 3, 23 or 43 to be integrated or accommodated, to which end a passage opening 11, 30 or 47 in the form of a sound hole is respectively provided, such components can also be used to determine other physical values such as, e.g., the temperature, moisture, pressure, brightness or, in general, the composition of gaseous or liquid media. Alternatively, the electronic component may be comprised of a high-frequency element.

In an embodiment according to FIG. 5, in which a substantially hermetic seal is provided, an acceleration sensor or position sensor or any other type of sensor for which shielding against environmental influences or influences from the external environment has to be safely provided may, for instance, be integrated in the free space provided by the cutout or recess.

In addition to shielding the component or sensor 3, 23, 43 or 63 from environmental influences, shielding may also be used to protect further elements or components of a printed circuit board region not illustrated in detail in the drawings, if, for instance, the determination of the composition of aggressive media in the region of the electronic component 63 is to be performed.

Overall, embedding of the components or sensors 3, 23, 43 or 63 is effected using method steps that are generally known in the manufacture of printed circuit boards.

The invention claimed is:

1. A method for integrating an electronic component into a printed circuit board, comprising the following steps of:
providing two completed printed circuit board elements, which more particularly consist of a plurality of interconnected layers or plies, wherein at least one of the printed circuit board elements comprises a cutout or depression;
arranging the component to be integrated on one of the printed circuit board elements or in the cutout of the at least one of the printed circuit board element; and
connecting the printed circuit board elements with the component being accommodated in the cutout, wherein evaluation electronics for the component is integrated in the printed circuit board, that the electronic component, in its state accommodated in the cutout, is shielded from the external environment of the two printed circuit board elements and/or neighboring regions of the printed circuit board elements and that, in the region of contact connections of the component to be integrated, a layer of a hermetically tight, non-conducting material is embedded in a printed circuit board element and a contact connection of the component is realized by blind holes formed through the hermetically sealing layer and filled with a conductive material or a plating.

2. The method according to claim 1, wherein the dimensions of the cutout are selected to exceed the dimensions of the component in at least one direction of extension of the component.

3. The method according to claim 2, wherein the dimensions of the cutout exceed the dimensions of the component in the at last one direction of extension by at least 5%, in particular at least 15%, of the respective dimension of the component.

4. The method according to claim 2, wherein the dimensions of the cutout are selected to exceed the dimensions of the component in any direction of extension of the component.

5. The method according to claim 1, wherein the electronic component to be integrated is formed by a sensor for determining a temperature, moisture, pressure, sound, brightness, acceleration, spatial position, composition of gaseous or liquid media, or a high-frequency element.

6. The method according to claim 1 wherein at least one passage opening running into the cutout for accommodating the component to be integrated is formed in at least one of the printed circuit board elements.

7. The method according to claim 1, wherein shielding is at least partially provided by substantially full-surface conducting layers of the printed circuit board elements and the substantially full-surface conducting layers have conducting regions.

8. The method according to claim 7, wherein the conducting regions of the printed circuit board elements used for shielding are additionally connected by conducting contact connections between the conducting regions of the printed circuit board elements.

9. The method according to claim 1, wherein the evaluation electronics for the component is integrated in the printed circuit board element on which the electronic component is supported, or to which the electronic component is contact-connected.

10. The method according to claim 1, wherein the connection of the printed circuit board elements is performed by soldering, eutectic bonding, thermocompression bonding, diffusion soldering, using a conductive adhesive and/or conducting or conductive adhesive films.

11. The method according to claim 1, wherein the cutout is produced in the at least one of the printed circuit board elements by clearing a partial region of the at least one of the printed circuit board elements after having connected said plurality of interconnected layers of the printed circuit board elements, using a material preventing the adhesion of said partial region.

* * * * *